United States Patent
Lu et al.

(10) Patent No.: US 9,455,342 B2
(45) Date of Patent: Sep. 27, 2016

(54) ELECTRIC FIELD MANAGEMENT FOR A GROUP III-NITRIDE SEMICONDUCTOR DEVICE

(71) Applicant: Cambridge Electronics, Inc., Cambridge, MA (US)

(72) Inventors: Bin Lu, Boston, MA (US); Tomas Palacios, Belmont, MA (US); Ling Xia, Somerville, MA (US); Mohamed Azize, Cambridge, MA (US)

(73) Assignee: CAMBRIDGE ELECTRONICS, INC., Cambridge, MA (US)

( * ) Notice: Subject to any disclaimer, the term of this patent is extended or adjusted under 35 U.S.C. 154(b) by 0 days.

(21) Appl. No.: 14/550,730

(22) Filed: Nov. 21, 2014

(65) Prior Publication Data

US 2015/0144957 A1 May 28, 2015

Related U.S. Application Data

(60) Provisional application No. 61/907,897, filed on Nov. 22, 2013.

(51) Int. Cl.
| | |
|---|---|
| H01L 29/15 | (2006.01) |
| H01L 29/778 | (2006.01) |
| H01L 29/40 | (2006.01) |
| H01L 29/417 | (2006.01) |
| H01L 29/20 | (2006.01) |

(52) U.S. Cl.
CPC ......... H01L 29/7787 (2013.01); H01L 29/402 (2013.01); H01L 29/405 (2013.01); H01L 29/41725 (2013.01); H01L 29/2003 (2013.01)

(58) Field of Classification Search
CPC ............. H01L 29/2003; H01L 29/402; H01L 29/41758; H01L 29/7787
USPC ............................ 257/76, 194, 192; 438/270
See application file for complete search history.

(56) References Cited

U.S. PATENT DOCUMENTS

| | | | |
|---|---|---|---|
| 6,274,893 B1 * | 8/2001 | Igarashi | H01L 29/7783 257/192 |
| 7,626,217 B2 | 12/2009 | Saxler | |
| 8,106,481 B2 | 1/2012 | Rao | |

(Continued)

OTHER PUBLICATIONS

N.-Q. Zhang, et al., IEEE Electron Device Lett, vol. 21, No. 9, p. 421 (2000).

(Continued)

*Primary Examiner* — Mohammed Shamsuzzaman
(74) *Attorney, Agent, or Firm* — Stuart H. Mayer; Mayer & Williams PC

(57) ABSTRACT

A semiconductor device includes a substrate, a first active layer, a second active layer, at least first and second electrodes, an E-field management layer, and at least one injection electrode. The first active layer is disposed over the substrate. The second active layer is disposed on the first active layer such that a laterally extending conductive channel arises which extends in a lateral direction. The laterally extending conductive channel is located between the first active layer and the second active layer. The first and second electrodes are electrically connected to the first active layer. The E-field management layer, which reduces the electric-field gradients arising in the first and second active layers, is disposed over the second active layer. The injection electrode is electrically connected to the E-field management layer.

22 Claims, 4 Drawing Sheets

(56) References Cited

U.S. PATENT DOCUMENTS

| | | | |
|---|---|---|---|
| 8,148,752 B2 | 4/2012 | Koshi et al. | |
| 8,816,395 B2* | 8/2014 | Bunin | H01L 29/42316 257/194 |
| 2006/0003556 A1 | 1/2006 | Lee et al. | |
| 2006/0145189 A1 | 7/2006 | Beach | |
| 2006/0189019 A1 | 8/2006 | Lee et al. | |
| 2006/0281205 A1 | 12/2006 | Park | |
| 2008/0023727 A1* | 1/2008 | Hoshi | H01L 29/402 257/194 |
| 2008/0121876 A1 | 5/2008 | Otsuka et al. | |
| 2008/0149941 A1 | 6/2008 | Li et al. | |
| 2008/0272397 A1* | 11/2008 | Koudymov | H01L 29/1606 257/192 |
| 2009/0072272 A1* | 3/2009 | Suh | H01L 29/1066 257/194 |
| 2009/0212325 A1* | 8/2009 | Sato | H01L 29/1066 257/192 |
| 2010/0270591 A1* | 10/2010 | Ahn | H01L 29/7782 257/194 |
| 2010/0314663 A1* | 12/2010 | Ito | H01L 29/1083 257/192 |
| 2010/0320505 A1* | 12/2010 | Okamoto | H01L 29/045 257/192 |
| 2011/0147798 A1* | 6/2011 | Radosavljevic | H01L 21/2256 257/194 |
| 2012/0153356 A1 | 6/2012 | Saunier | |
| 2012/0220089 A1* | 8/2012 | Imada | H01L 29/0619 438/270 |
| 2012/0307534 A1* | 12/2012 | Yamada | H01L 29/2003 363/123 |
| 2013/0099284 A1* | 4/2013 | Tserng | H01L 29/7787 257/194 |
| 2013/0112943 A1* | 5/2013 | Tanaka | H01L 33/06 257/13 |
| 2013/0112986 A1 | 5/2013 | Hsiung et al. | |
| 2013/0200391 A1 | 8/2013 | Bedair et al. | |
| 2014/0001479 A1 | 1/2014 | Kudymov | |
| 2014/0091322 A1* | 4/2014 | Ishikura | H01L 29/452 257/76 |
| 2014/0209922 A1* | 7/2014 | Ota | H01L 29/42316 257/76 |
| 2015/0144953 A1* | 5/2015 | Hill | H01L 29/402 257/76 |

OTHER PUBLICATIONS

W. Saito, et al., IEEE Trans. Electron Devices, vol. 50, No. 12, p. 2528 (2003).

H. Xing, et al., IEEE Electron Device Lett, vol. 25, No. 4, p. 161 (2004).

W. Saito, et al., IEEE Trans. Electron Devices, vol. 54, No. 8, p. 1825 (2007).

* cited by examiner

ELECTRIC FIELD MANAGEMENT FOR A GROUP III-NITRIDE SEMICONDUCTOR DEVICE

FIELD

The invention relates generally to semiconductor devices and more particularly to an electric-field management layer for reducing the high electric field concentrations that arises in high voltage semiconductor devices.

BACKGROUND

Group III-Nitride semiconductors have attracted great interest for their application in power electronics. Due to the high critical electric field (e.g., 3 MV/cm), high density (e.g., $10^{13}/cm^2$) and the high mobility (e.g., >1200 $cm^2/V \cdot s$) two-dimensional-electron-gas (2DEG) arising in group III-nitride heterostructures, group III-nitride-based transistors have the potential to greatly reduce power loss and minimize system size relative to Si-based power electronic devices such as power switches.

A power switch has an on state that allows the device to conduct current, and an off state that prevents the device from conducting current. When in the on state, a power switch may conduct tens or hundreds of amperes while the voltage across the switch is less than one volt. When in the off state, the power switch typically must withstand hundreds or thousands of volts while conducting substantially zero current. The voltage that the device can withstand in the off state while conducting no more than a given small value of current is sometimes referred to as the breakdown voltage.

Electric field management is important in high voltage power switches. Currently, field-plate structures are widely used in III-Nitride power devices such as transistors and diodes to reduce the electric field concentration at the edge of the depletion region (e.g. the edge of the gate electrode in transistors or the anode in diodes) of the devices in their off-state and increase their breakdown voltages. However, the fabrication of conventional field-plate structures can become increasingly difficult as a larger number of field-plates may be required to reduce the electric field concentration when the device breakdown voltage increases. The additional field-plates also increase the overall capacitance of the device, reducing its switching frequency.

SUMMARY

In accordance with one aspect of the present invention, a semiconductor device is provided which includes a substrate, a first active layer, a second active layer, at least first and second electrodes, an E-field management layer, and at least one injection electrode. The first active layer is disposed over the substrate. The second active layer is disposed on the first active layer such that a laterally extending conductive channel arises which extends in a lateral direction. The laterally extending conductive channel is located between the first active layer and the second active layer. The first and second electrodes are electrically connected to the first active layer. The E-field management layer, which reduces the electric-field gradients arising in the first and second active layers, is disposed over the second active layer. The injection electrode is electrically connected to the E-field management layer.

DESCRIPTION OF THE INVENTION

In the following description, numerous specific details are set forth in order to provide a thorough understanding of exemplary embodiments or other examples described herein. However, it will be understood that these embodiments and examples may be practiced without the specific details. In other instances, well-known methods and procedures have not been described in detail, so as not to obscure the following description. Further, the embodiments disclosed are for exemplary purposes only and other embodiments may be employed in lieu of, or in combination with, the embodiments disclosed.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

Figure 1:
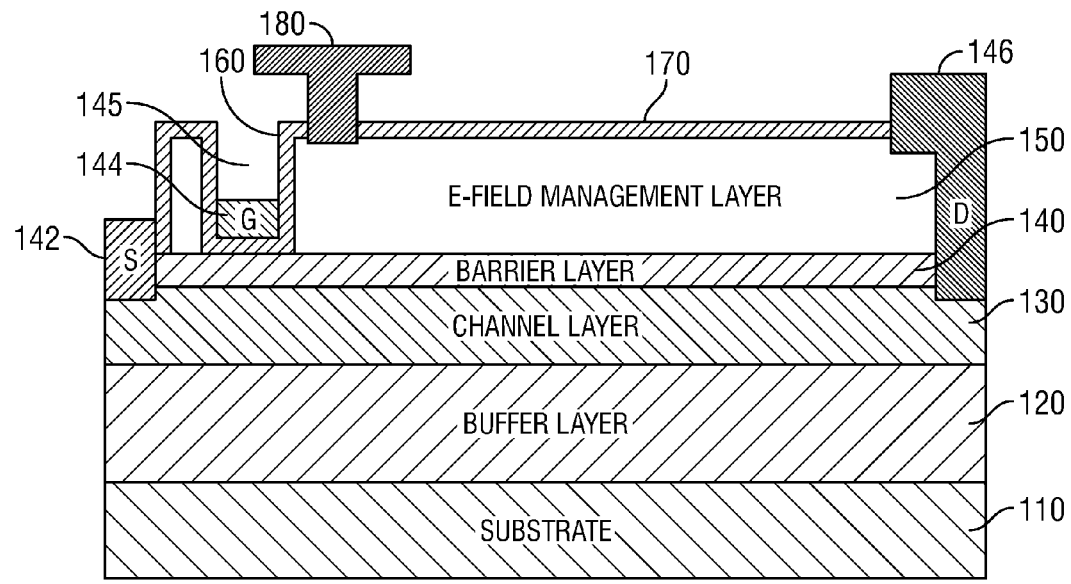
FIG. 1 shows a cross-sectional view of one embodiment of a semiconductor device constructed in accordance with the teachings presented herein.

FIG. 1 shows a cross-sectional view of one embodiment of a semiconductor device 100 constructed in accordance with the teachings presented herein. The semiconductor device 100 in this illustrative embodiment is depicted as a transistor that is operational in an enhancement mode or a depletion-mode. For instance, in some embodiments the transistor may be high voltage power switching device. However, the teachings presented herein are equally applicable to other semiconductor devices and is not limited to the particular devices described below.

The various layers of the semiconductor device 100 may be disposed over a substrate 110 that may be formed from various materials such as silicon (Si), silicon carbide (SiC), sapphire, zinc-oxide (ZnO) or any of a variety of semiconductor materials. A first active layer 130 and a second active layer 140 are formed over the substrate 110 in the example of FIG. 1. Various techniques of fabrication may call for layers of other materials to be disposed between the substrate 110 and the first active layer 130 to facilitate the construction of the device. For example, a buffer layer 120 such as a GaN layer may be disposed between the substrate 110 and the first active layer 130.

The first active layer 130 in the example of FIG. 1 is comprised of semiconductor materials containing nitride compounds of elements from Group III of the Periodic Table of the Elements. For example, the first active layer 130 may comprise gallium nitride (GaN). As another example, the first active layer 130 may comprise $In_xAl_yGa_zN$ ($0 \leq x \leq 1$, $0 \leq y \leq 1$, $0 \leq z \leq 1$, $x+y+z=1$).

Similar to the first active layer 130, the second active layer 140 in the example of FIG. 1 may be comprised of semiconductor materials containing nitride compounds of elements from Group III of the Periodic Table of the Elements. For example, the second active layer 140 may comprise aluminum gallium nitride ($Al_xGa_yN$, for $0 \leq x \leq 1$, $0 \leq y \leq 1$, $x+y=1$). In other examples, different Group III nitride semiconductor materials such aluminum indium nitride (AlInN) and aluminum indium gallium nitride (AlInGaN) may comprise the second active layer 140. As another example, the second active layer 140 may be a non-stoichiometric compound of a Group III nitride semiconductor material such as $In_xAl_yGa_zN$ ($0 \leq x \leq 1$, $0 \leq y \leq 1$, $0 \leq z \leq 1$, $x+y+z=1$). In some embodiments the second active layer may comprise a series of sublayers of different Group III nitride materials.

The second active layer 140, which generally has a higher bandgap than the first active layer 130, gives rise to a layer of electric charge in the first active layer 130 near the second active layer 140. The first active layer 130 is sometimes called the channel layer. The second active layer 140 is sometimes called the barrier layer or the donor layer. The layer of electric charge is sometimes called a two-dimensional electron gas (2DEG) because electrons, trapped in the quantum well that results from the difference in the bandgaps, are free to move in two dimensions but are tightly confined in the third dimension.

An electric (E)-field management layer 150 is disposed over or on the second active layer 140. The E-field management layer 150 reduces the electric-field gradients that arise in the first and second active layers. The E-field management layer 150 may be comprised of semiconductor materials. For example, the E-field management layer 150 may comprise a nitride semiconductor compound such as $Al_xGa_yN$. Alternatively, the E-field management layer 150 may be formed from other materials such as a conductive oxide (e.g., ZnO and $Ga_2O_3$), for instance.

The E-field management layer 150 can be either intrinsic or doped with impurities such as carbon (C), iron (Fe), magnesium (Mg), or zinc (Zn) or contain defects such as point defects to increase its resistivity. In one embodiment the E-field management layer 150 has a resistivity greater than 1 k$\Omega$×cm. In some embodiments the concentration of impurities in the E-field management layer 150 may range from $10^{15}$-$10^{20}$/cm$^3$. In other embodiments the concentration of defects in the E-field management layer 150 may range from $10^{16}$-$10^{19}$/cm$^3$. If impurities are present, they may be incorporated into the E-field management layer 150 using any suitable technique such as ion-implantation and diffusion or by incorporating them during epitaxial growth of the E-field management layer 150.

In the example of FIG. 1 a conductive source electrode 142 and a conductive drain electrode 146 are in ohmic contact with the first active layer 130. A conductive gate electrode 144 is located between the source electrode 142 and the drain electrode 146. The gate electrode 144 may be formed in a gate recess 145 that is etched through the E-field management layer 150 until it reaches or extends into the second active layer 140. The gate recess 145 is lined with a dielectric material so that a gate dielectric layer 160 is interposed between the gate electrode 144 and the second active layer 140. In some embodiments the gate dielectric layer 160 may be fabricated over all or part of the E-field management layer 150 after the gate recess 145 is etched. The gate dielectric 160 may be formed, for example, from $Al_2O_3$, $Si_xO_y$, $Si_xN_y$, $Si_xO_yN_z$, Polytetrafluoroethylene (Teflon™), $HfO_2$, AlN or any other insulator or a combination of insulators that are suitable for use as a gate dielectric.

In some embodiments a thin layer portion of the E-field management layer 150 may extend underneath the gate dielectric 160.

In some embodiments the gate dielectric layer 160 is not present and a Schottky contact is formed between the gate electrode 144 and the second active layer 140.

In yet other embodiments, the second active layer 140 below the gate electrode 144 can be partially or completely removed.

As used in this disclosure, an electrical connection between two conductive patterns (e.g., metal or poly-silicon electrodes) is a connection in which the two patterns cannot have independent electrical potentials. Thus, in a non-transient, DC state, the two electrically connected patterns will have the same electrical potential. For example, two metal patterns that are connected to each other through only a metal are electrically connected. An ohmic contact defines an electrical property between two materials in contact with each other, in which the relationship between the voltage and the current is linear and symmetric for both directions of the current flowing between the contacting material.

As further used in this disclosure, another type of contact that defines an electrical connection is a Schottky contact, which is formed at the junction between certain metal and semiconductor materials.

In addition to being in ohmic contact with the first active layer 130, the conductive drain electrode 146 also establishes an ohmic or Schottky contact with the E-field management layer 150. In some embodiments, however, the drain electrode 146 does not establish a contact with the E-field management layer 150. The isolation between the drain electrode 146 and the E-field management layer 150 may be accomplished in any suitable manner. For example, a trench or recess filled with a dielectric material may be etched through the E-field management layer 150 adjacent to the drain electrode 146. Alternatively, the length of the E-field management layer 150 in the lateral direction can be reduced, in some cases so that it is as short in length as the injection electrode 180.

A second dielectric layer 170 is formed over the E-field management layer 150 and the gate electrode 144. If, as in FIG. 1, the gate dielectric layer 160 is present, the second dielectric layer 170 may be formed on the first gate dielectric layer 160. Similar to the gate dielectric layer 160, the second dielectric layer 170 can be formed, for example, from $Al_2O_3$, $Si_xO_y$, $Si_xN_y$, $Si_xO_yN_z$, Polytetrafluoroethylene (Teflon™), $HfO_2$, AlN or any other insulator or a combination of insulators that are suitable for use as a passivation layer.

With continuing reference to FIG. 1, an injection electrode 180 is disposed between the gate electrode 144 and the drain electrode 146. A region under the injection electrode 180 is recessed by etching through the second dielectric layer 170 and, if present, the gate dielectric layer 160 so that the injection electrode 180 is electrically connected to the E-field management layer 150. In some embodiments the injection electrode 180 may extend into the E-field management layer 150.

The electrical connection between the injection electrode 180 and the E-field management layer 150 can be either Schottky or ohmic. The injection electrode 180 may be formed from any suitable material for establishing the desired type of electrical contact. For example, if the contact is a Schottky contact, suitable materials include by way of illustration, nickel (Ni), platinum (Pt), titanium (Ti), molybdenum (Mo), tungsten (W), aluminum (Al), gold (Au), silicide, doped polysilicon and combinations thereof.

Figure 2:
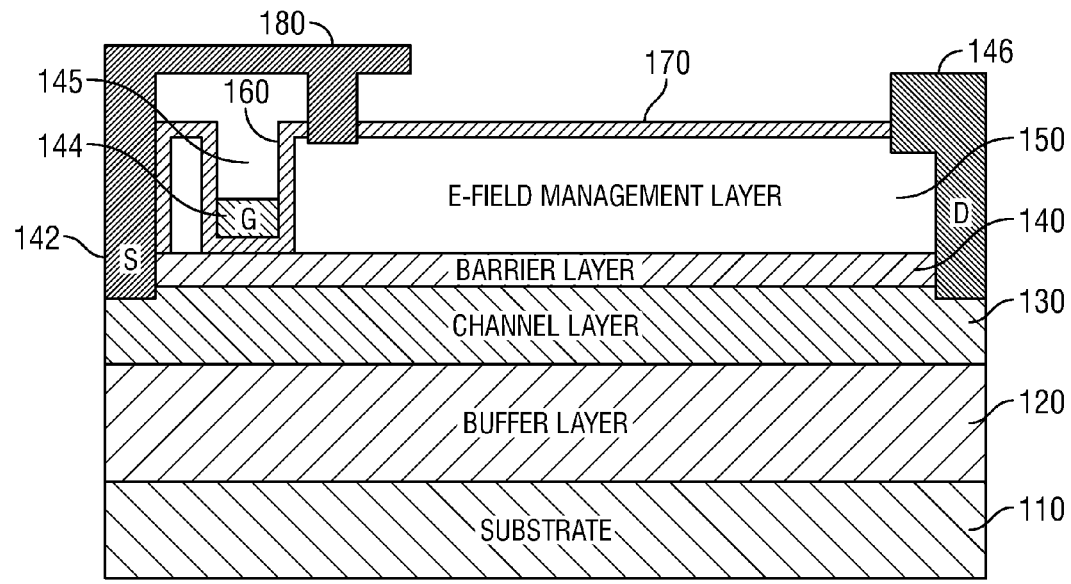
FIGS. 2-7 show cross-sectional views of alternative embodiments of the semiconductor device of FIG. 1.
Figure 3:
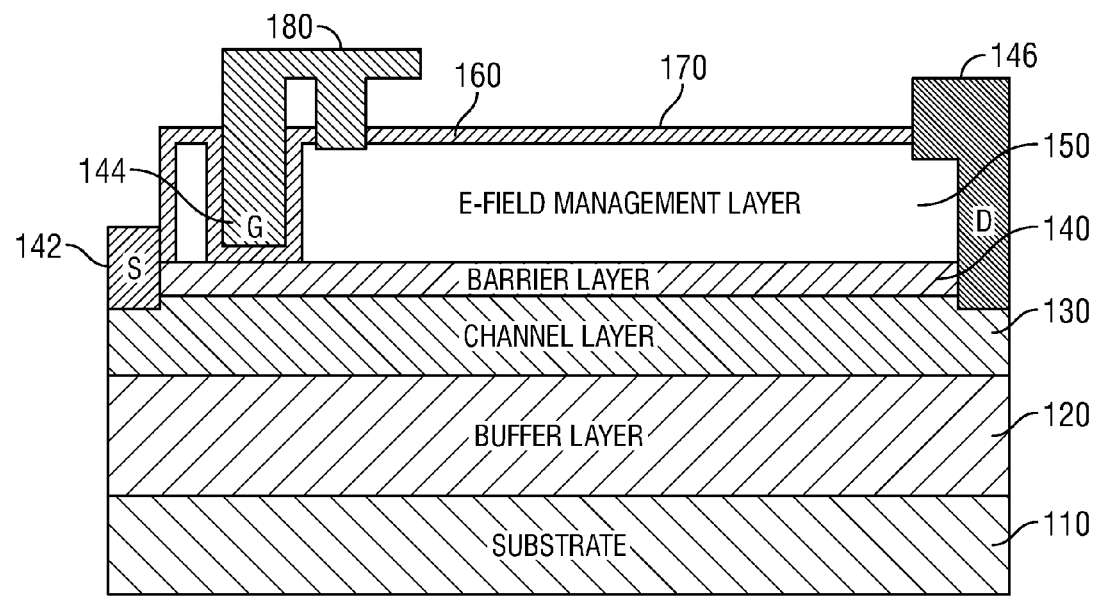

The injection electrode 180 may extend laterally over the second dielectric layer 170 towards the drain electrode, as shown in FIG. 1. Furthermore, in the example of FIG. 1, the injection electrode 180 does not establish an electrical connection with either the source electrode 142 or the gate electrode 144. That is, in this embodiment the injection electrode 180 has an electrical potential different from that of the source electrode 142 and the gate electrode 144. Alternatively, as shown in FIG. 2, the injection electrode 180 may be electrically connected to the source 142 but not the gate electrode 144. In yet another embodiment, shown in FIG. 3, the injection electrode 180 may be electrically connected to the gate electrode 144 but not the source electrode 142. In FIGS. 1, 2 and 3, as well as the figures that follow, like elements are denoted by like reference numerals.

While the embodiments of the semiconductor device shown in the figures include only a single injection electrode 180, in alternative embodiments two or more injection electrodes 180 may be provided over the second dielectric layer 170. In these embodiments different injection electrodes may extend to the same or different depths within the E-field management layer 150. Moreover, in other embodiments, multiple injection electrodes may define multiple point contacts on or in the E-field management layer, some or all of which may or may not be electrically connected to one another. The point contacts may extend over the E-field management layer 150 in one or more rows or they may extend in a plane over the E-field management layer 150. In one embodiment, if two injection electrodes are employed, one of the injection electrodes may be electrically connected to the source or gate electrode and the other injection electrode may be at a floating electrical potential.

Figure 4:
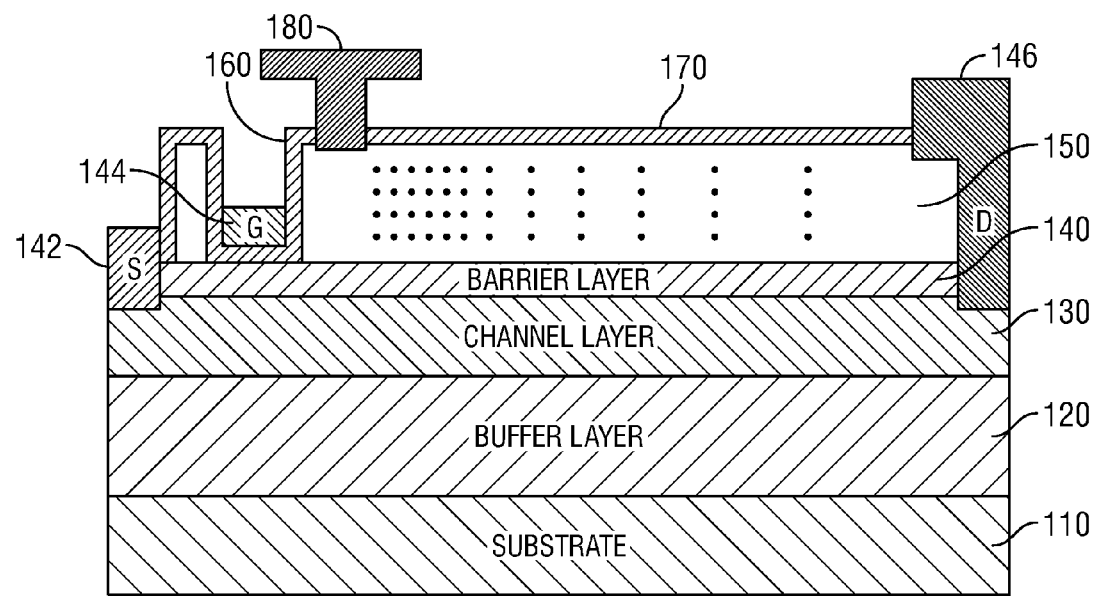
Figure 5:
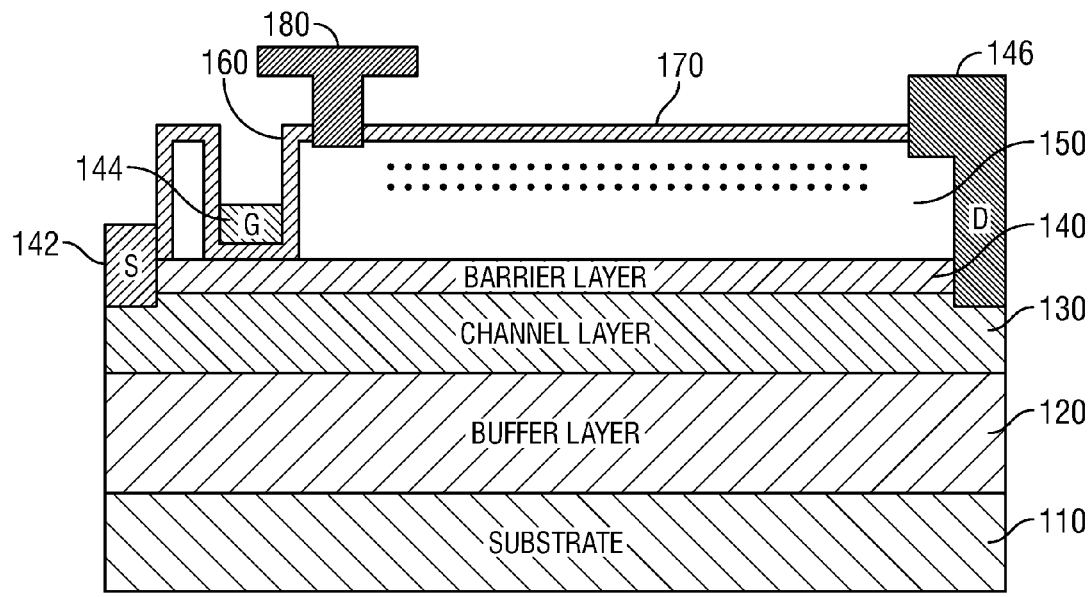

The impurity doping density in the E-field management layer 150 can be uniform throughout or it or can vary in the lateral direction between the gate electrode 144 and the drain electrode 170. Alternatively, or in addition thereto, the impurity doping density may vary in the vertical direction between the E-field management layer 150 and the substrate 110. As previously mentioned, the impurity doping can be formed during epitaxial growth of the E-field management layer 150, by ion implantation, diffusion of impurities, or any other suitable method. Two examples of the impurity density distribution in the E-field management layer are shown in FIGS. 4 and 5. In FIG. 4 the impurity density is highest near the injection electrode 180 and decreases in the lateral direction toward the drain electrode 150. In FIG. 5 the impurity density is uniform in the lateral direction toward the drain electrode 150. However, variations in the impurity concentration other than those shown in FIGS. 4 and 5 can be realized as well.

Without being bound by any theory of operation, the following discussion concerning the presence and influence of carriers, impurities, defects, trap energy levels and the like is presented to facilitate an understanding of the various aspects of the present invention.

When the device is operated under high drain bias conditions, carriers (e.g. electrons) can be injected from the injection electrode into the E-field management layer. As a result, the E-field management layer will be e.g., negatively charged, breaking the charge neutrality in this layer. The impurities or defects in the E-field management layer create trap energy levels in the band gap of the E-field management layer. They can be engineered to have a desirable electron trapping time constant in order to control the leakage current and the potential distribution between the injection electrode and the drain electrode. Because of the carriers (e.g. electrons) injected in the E-field management layer, the negatively charged electrons in the E-field management layer (assuming the injected carriers are electrons) will automatically compensate the exposed positive charge of the depletion region of the channel, making the electric field more uniform between the gate electrode and the drain electrode in the off-state of the transistor.

Figure 6:
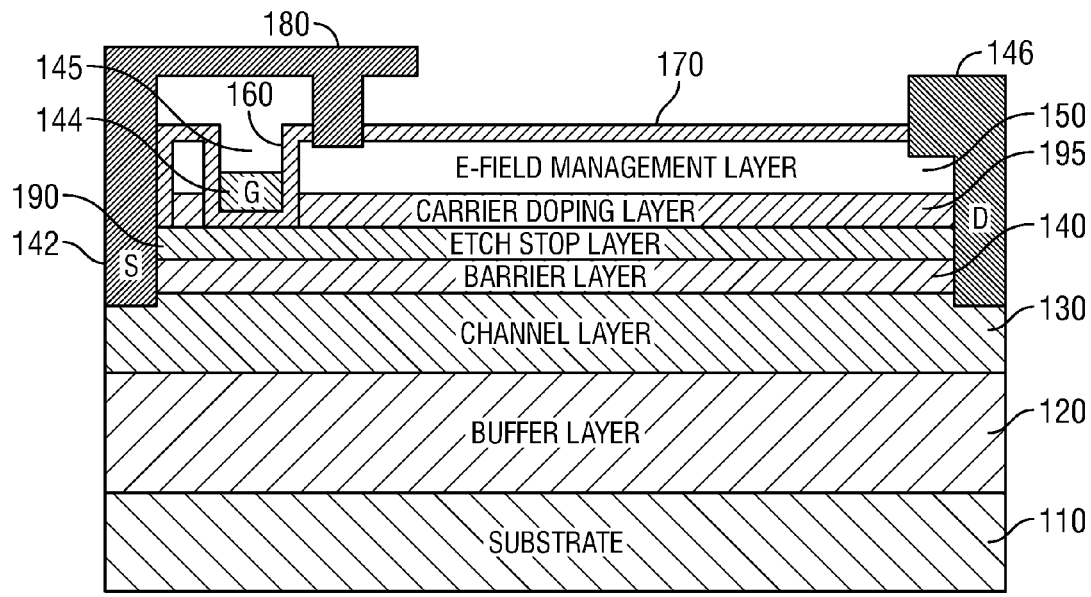

In one embodiment, shown in FIG. 6, an etch stop layer 190 (i.e. AlN layer) is placed over the second active layer 140 and a carrier doping layer 195 (i.e. n-type GaN layer) is placed on top of the etch stop layer 190 to provide electrons in the channel layer; the E-field management layer 150 is placed on top of the carrier doping layer 195. In this embodiment the gate electrode 144 is formed by etching a gate recess 145 that extends through both the E-field management layer 150 and the carrier doping layer 195. The gate dielectric layer 160 may be formed on the etch stop layer 190 by lining the recess 145. In some embodiments the gate recess 145 can be further etched so that it extends through the etch stop layer 190 and into the second active layer 140. The injection electrode 180 in the embodiment shown in FIG. 6 is connected to the source electrode 142. However, as previously discussed, the injection electrode can be electrically connected to the gate electrode 144 and not the source electrode 142. In yet another embodiment, the injection electrode 180 may be electrically connected to neither gate electrode 144 nor the source electrode 142 so that it is at a different electric potential from both the gate and source electrodes 144 and 142.

Figure 7:
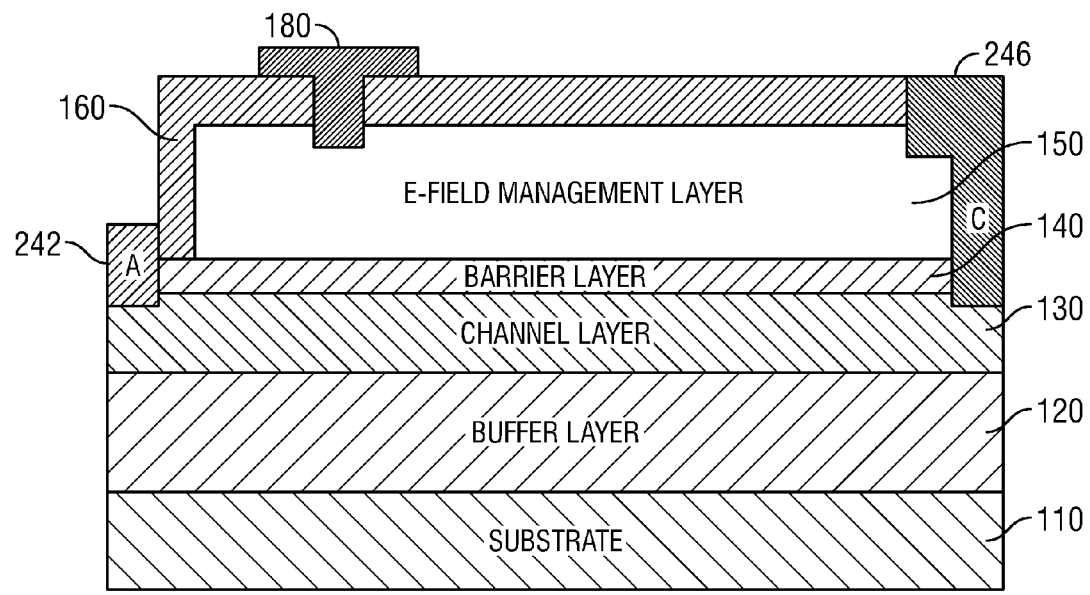

While the teachings of the present invention have been described above in the context of a transistor, these teachings may be used with other semiconductor devices as well. For example, FIG. 7 shows a diode 200 that employs an E-field management layer 150. The injection electrode 180 may be located in the lateral direction between the anode 242 and cathode 246. In some embodiments the injection electrode 180 can be electrically connected to the anode 242 or it may have an electrical potential different from that of the anode 242.

The semiconductor devices described herein may be fabricated using an epitaxial growth process. For instance, a reactive sputtering process may be used where the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, metal organic chemical vapor deposition (MOCVD) may be employed, wherein the substrate is exposed to an atmosphere containing organic compounds of the metals as well as to a reactive nitrogen-containing gas, such as ammonia, and a dopant-containing gas while the substrate is maintained at an elevated temperature, typically around 700-1100 C. The gaseous compounds decompose and form a doped semiconductor in the form of a film of crystalline material on the surface of the substrate. The substrate and the grown film are then cooled. As a further alternative, other epitaxial growth methods, such as molecular beam epitaxy (MBE) or atomic layer epitaxy may be used. Yet additional techniques that may be employed include, without limitation, Flow Modulation Organometallic Vapor Phase Epitaxy (FM-OM-VPE), Organometallic Vapor-Phase Epitaxy (OMVPE), Hydride Vapor-Phase Epitaxy (HVPE), and Physical Vapor Deposition (PVD). Standard metallization techniques, as known in the art of semiconductor fabrication, can be used to form the electrodes.

The above description of illustrated examples of the present invention is not intended to be exhaustive or limited to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

The invention claimed is:

1. A semiconductor device, comprising:
   a substrate;
   a first active layer disposed over the substrate;
   a second active layer disposed on the first active layer such that a laterally extending conductive channel arises which extends in a lateral direction, the laterally extending conductive channel being located between the first active layer and the second active layer;
   first and second electrodes electrically connected to the first active layer;
   an E-field management layer for reducing electric-field gradients arising in the first and second active layers, the E-field management layer being disposed over the second active layer, the E-field management layer having a resistivity greater than 1 kΩ×cm;
   an injection electrode electrically connected to the E-field management layer;
   wherein the first and second electrodes are source and drain electrodes, respectively, and further comprising a gate electrode disposed completely in a recess extending into the E-field management layer above an upper surface of the second active layer between the source electrode and the drain electrode,
   wherein the injection electrode is disposed between the gate electrode and the drain electrode extending laterally towards the drain electrode without any electrical connection with either the source electrode, the drain electrode or the gate electrode.

2. The semiconductor device according to claim 1, wherein the first active layer comprises a group III nitride semiconductor material.

3. The semiconductor device according to claim 2, wherein the first active layer comprises $In_xAl_yGa_zN$ ($0 \leq x \leq 1$, $0 \leq y \leq 1$, $0 \leq z \leq 1$, $x+y+z=1$).

4. The semiconductor device according to claim 2, wherein the second active layer comprises a group III nitride semiconductor material, the second active layer having a wider band gap than the first active layer.

5. The semiconductor device according to claim 4, wherein the second active layer comprises $In_xAl_yGa_zN$ ($0 \leq x \leq 1$, $0 \leq y \leq 1$, $0 \leq z \leq 1$, $x+y+z=1$).

6. The semiconductor device according to claim 1, wherein the E-field management layer comprises $In_xAl_yGa_zN$ ($0 \leq x \leq 1$, $0 \leq y \leq 1$, $0 \leq z \leq 1$, $x+y+z=1$).

7. The semiconductor device according to claim 1, wherein the E-field management layer has a thickness about equal to or greater than 2 nm.

8. The semiconductor device according to claim 1, wherein the E-field management layer comprises an intrinsic material or a material that includes therein impurities and/or defects that give rise to the resistivity.

9. The semiconductor device according to claim 1 wherein the E-field management layer includes impurities that are selected from the group consisting of Carbon, Iron, Magnesium and Zinc.

10. The semiconductor device according to claim 1, wherein the E-field management layer includes impurities that have trap levels within a band gap of the E-field management layer or has defects.

11. The semiconductor device according to claim 1, wherein the injection electrode and the E-field management layer establish a Schottky or ohmic contact therebetween.

12. The semiconductor device according to claim 1, wherein the drain electrode and the E-field management layer establish a Schottky or ohmic contact therebetween.

13. The semiconductor device according to claim 1, further comprising an insulator layer disposed over at least a portion of the E-field management layer, wherein at least a portion of the injection electrode is disposed over the insulator layer.

14. The semiconductor device according to claim 13, wherein the insulator layer comprises at least one dielectric selected from the group consisting of $Al_2O_3$, $Si_xO_y$, $Si_xN_y$, $Si_xO_yN_z$, Polytetrafluoroethylene, $HfO_2$, AlN or a combination thereof.

15. The semiconductor device according to claim 13, wherein the insulator layer has a dielectric constant below 200.

16. The semiconductor device according to claim 1, further comprising a gate dielectric layer over which the gate electrode is disposed.

17. The semiconductor device according to claim 16, wherein the gate dielectric layer comprises at least one dielectric selected from the group consisting of $Al_2O_3$, $Si_xO_y$, $Si_xN_y$, $Si_xO_yN_z$, Polytetrafluoroethylene, $HfO_2$, AlN or a combination thereof.

18. The semiconductor device according to claim 16, wherein the gate dielectric layer has a dielectric constant below 200.

19. The semiconductor device according to claim 1, wherein the E-field management layer comprises a semiconductor material.

20. The semiconductor device according to claim 1, wherein the E-field management layer comprises a conductive oxide material.

21. A semiconductor device, comprising:
    a substrate;
    a first active layer disposed over the substrate;
    a second active layer disposed on the first active layer such that a laterally extending conductive channel arises which extends in a lateral direction, the laterally extending conductive channel being located between the first active layer and the second active layer;
    first and second electrodes electrically connected to the first active layer;
    an E-field management layer for reducing electric-field gradients arising in the first and second active layers, the E-field management layer being disposed over the second active layer, wherein the E-field management layer includes impurities selected from the group consisting of Carbon, Iron, Magnesium and Zinc;
    an injection electrode electrically connected to the E-field management layer;
    wherein the first and second electrodes are source and drain electrodes, respectively, and further comprising a gate electrode disposed completely in a recess extending into the E-field management layer above an upper surface of the second active layer between the source electrode and the drain electrode, wherein the injection electrode is disposed between the gate electrode and the drain electrode extending laterally towards the drain electrode without any electrical connection with either the source electrode, the drain electrode or the gate electrode.

22. The semiconductor device according to claim 1 wherein the gate electrode is disposed adjacent to the E-field management layer.

* * * * *